United States Patent
Nguyen et al.

(10) Patent No.: US 6,456,539 B1
(45) Date of Patent: Sep. 24, 2002

(54) METHOD AND APPARATUS FOR SENSING A MEMORY SIGNAL FROM A SELECTED MEMORY CELL OF A MEMORY DEVICE

(75) Inventors: Sang Thanh Nguyen, Union City; Loc B. Hoang, San Jose; Hung Q. Nguyen, Fremont, all of CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/903,919

(22) Filed: Jul. 12, 2001

(51) Int. Cl.[7] .............................................. G11C 7/00
(52) U.S. Cl. .................. 365/189.07; 365/185.2; 365/185.21; 365/189.05; 365/207
(58) Field of Search ....................... 365/189.07, 189.05, 365/207, 185.2, 185.21, 189.01, 185.01

(56) References Cited

U.S. PATENT DOCUMENTS

| | | | | |
|---|---|---|---|---|
| 5,594,691 A | * | 1/1997 | Bashir | 365/185.03 |
| 5,703,820 A | * | 12/1997 | Kohno | 365/185.25 |
| 2002/0021588 A1 | * | 2/2002 | Homma | 365/189.07 |

* cited by examiner

*Primary Examiner*—Hoai Ho
(74) *Attorney, Agent, or Firm*—Gray Cary Ware & Freidenrich LLP

(57) ABSTRACT

The present invention assures that valid and correct sensed data is latched before outputting from the memory device. The valid or correct sensed data is determined by the reference signal being first compared to two margin reference signals prior to latching the output of the comparator between the reference signal and the sensed signal from the selected memory cell. This maximizes the performance of the read operation as well as ensures the correct valid sense data is latched.

12 Claims, 3 Drawing Sheets

US 6,456,539 B1

METHOD AND APPARATUS FOR SENSING A MEMORY SIGNAL FROM A SELECTED MEMORY CELL OF A MEMORY DEVICE

TECHNICAL FIELD

The present invention relates to a circuit and a method for self-tracking dynamic sensing of a memory cell having built-in margins, and more particularly to a circuit and a method for sensing a memory signal from a nonvolatile memory device of the floating gate storage cell type.

BACKGROUND OF THE INVENTION

Sensing circuits to detect a memory signal from a selected memory cell of a memory device, such as a nonvolatile memory cell device of the floating gate storage type, are well known in the art. Referring to FIG. 1, there is shown a block level diagram of such a sensing circuit. Such a circuit is disclosed in U.S. Pat. No. 5,386,158. As disclosed in the '158 Patent, a sensing circuit 10 receives a memory signal from a selected memory cell, such as memory cell 12m from a memory cell array 12. The signal is passed through a multiplexer 16 to a first voltage amplifier 20 and to a first current mirror 22. At the same time, during the sensing operation, a reference cell or a "dummy" cell 14, generates a reference signal which is supplied to a second voltage amplifier 24, and to a second current mirror circuit 26. The sense signal 104, which is the output of the first current mirror circuit 22, and the sense ref signal 102, which is the output of the second current mirror circuit 26 are compared in a comparator 28. If the current from the sense signal 104 (representing the current flow through the selected memory cell) is greater than the current from the sense ref signal 102 (representing the current flow from the dummy cell 14), then the output of the comparator 28, Sout, will be in one state. If the current from the sense signal 104 (representing the current flow through the selected memory cell) is less than the current from the sense ref signal 102 (representing the current flow from the dummy cell 14), then the output of the comparator 28, Sout, will be in a different state. The Sout signal is then supplied directly to the output buffer and is the output of the memory device.

Referring to FIG. 2, there is shown in detailed circuit diagram the circuit shown in FIG. 1, and as disclosed in U.S. Pat. No. 5,386,158.

Because the sensing mechanism disclosed in U.S. Pat. No. 5,386,158 is current sensing type, care must be taken to activate the comparator 28 at the appropriate time. If the comparator 28 were activated too soon, an erroneous reading may result because the dummy cell 14 and the selected memory cell 12m have not reached a steady state of current flow. In the prior art, one way to insure that the sensing circuit 10 and the dummy cell 14 and the selected memory cell 12m have reached a steady state is to impose a delay on the sensing circuit 10 before outputting the Sout signal from the memory device. However, such a delay unnecessarily decreases the performance of the read operation. Accordingly, the present invention provides a self-tracking dynamic scheme to ensure the sense data are valid prior to outputting sensed data from the memory device, with a minimum of delay.

SUMMARY OF THE INVENTION

In the present invention, a method of sensing a memory signal from a selected memory cell of a memory device is disclosed. A reference signal generated from the memory device is compared to a threshold signal to determine the operational status of the memory device. The memory signal is compared to the reference signal, and generates a sensed signal. The sensed signal is outputted in response to the comparison between the reference signal and the threshold signal.

The present invention also relates to an apparatus for generating an output signal from the memory device with said output signal being the state of the selected memory cell sensed.

DETAILED DESCRIPTION OF THE INVENTION

Figure 1:
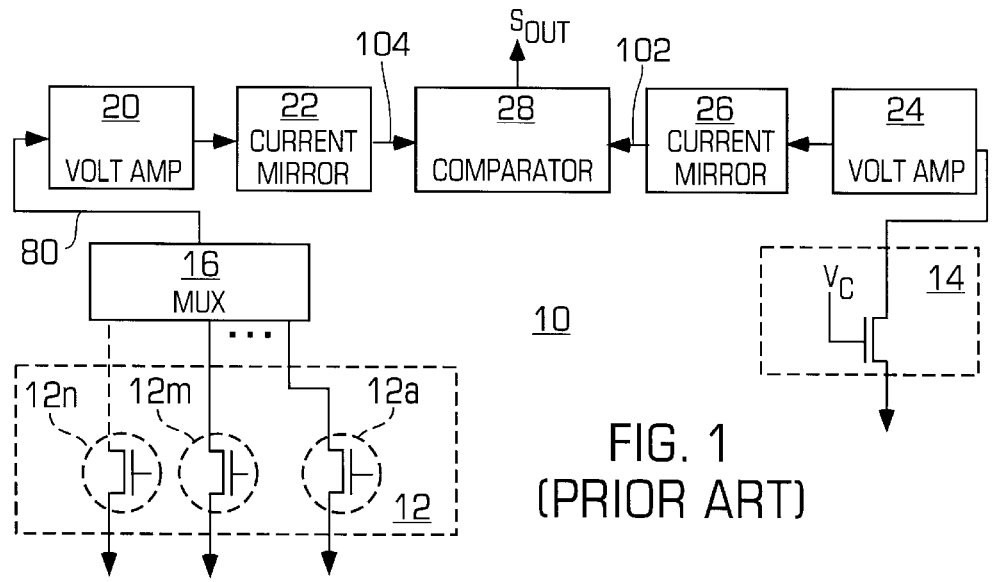
FIG. 1 is a block level diagram of a sensing circuit of the prior art.
Figure 2:
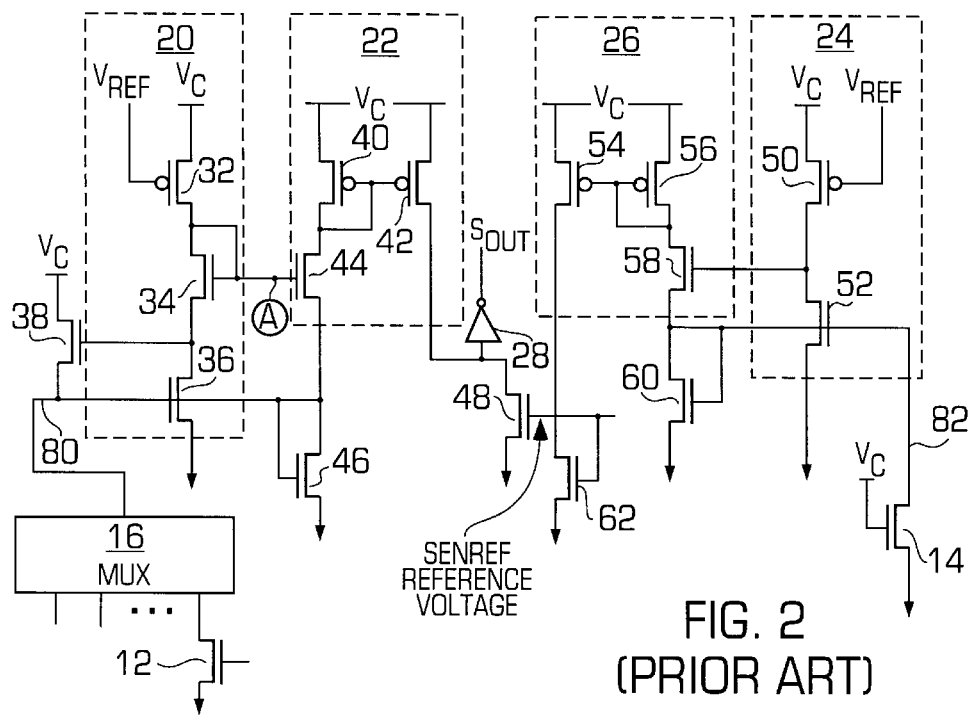
FIG. 2 is a detailed circuit diagram of a sensing circuit of the prior art.
Figure 3:
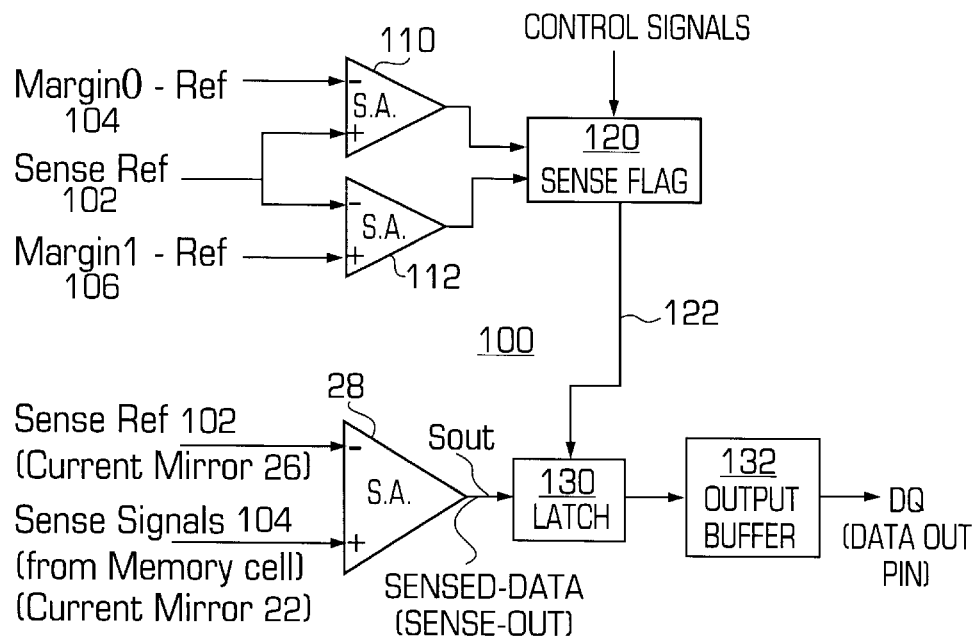
FIG. 3 is a block level diagram of an improved circuit of the present invention for use with the sensing circuit of the prior art.

Referring to FIG. 3, there is shown a block level diagram of an improved sensing circuit 100 of the present invention for use in the sensing circuit 10 shown in FIG. 1. As previously discussed, the sense ref signal 102 is the output of the second current mirror circuit 26. The sense signal 104 is the output of the first current mirror circuit 22. These are both applied to the comparator 28 which produces the Sout signal, all as done in the prior art shown in FIG. 1.

In the improvement, the sense ref signal 102 is also supplied to the positive terminal of a first sense amplifier 110. A margin 0 ref signal 108 is supplied to the negative terminal of the first sense amplifier 110. The sense ref signal 102 is also supplied to the negative terminal of a second sense amplifier 112. A margin 1 ref signal 106 is supplied to the positive terminal of a second sense amplifier 112. The output of the first sense amplifier 110 and the second sense amplifier 112 are supplied to a logic circuit 120, which also receives a control signal. The output of the logic circuit 120 is a latch control signal 122 which is supplied to a latch 130. The Sout signal from the comparator 28 is also supplied to the latch 130. The output of the latch 130 is supplied to an output buffer 132, which produces as its output the data out from the memory device to which the sensing circuit 100 is a portion thereof.

As previously discussed, the sense ref signal 102 is the output of the second current mirror 26 and is produced as a result of current flowing through the reference cell or dummy cell 14. The sense ref signal 102 is compared to a margin 0 ref signal 108 and a margin 1 ref signal 106. These signals, margin 0 ref and margin 1 ref, are produced on the same substrate as the memory device circuit to which the sensing circuit 100 is a portion thereof. As can be seen from the circuit diagram shown in FIG. 3, the output of the first sense amplifier 110 will be high if the sense ref signal 102 is greater than the margin 0 ref signal 108. Further, the output of the second sense amplifier 112 will also be high if the margin 1 ref signal 106 is greater than the sense ref signal 102. When this condition occurs, the sense ref signal 102 is deemed to be within the margin of reading and therefore the logic circuit 120 would then generate the latch control signal 122. In a preferred embodiment, the logic circuit 120 is simply an AND gate in which the outputs of the first sense amplifier 110, second sense amplifier 112 and the control signal are ANDed together to generate the latch control signal 122. When the latch control signal 122 is high, the Sout signal or the output of the comparator 28 is then latched into the latch 130. The output of latch 130 then is supplied to the output buffer 132 which produces as its output the output of the memory device.

Figure 4:
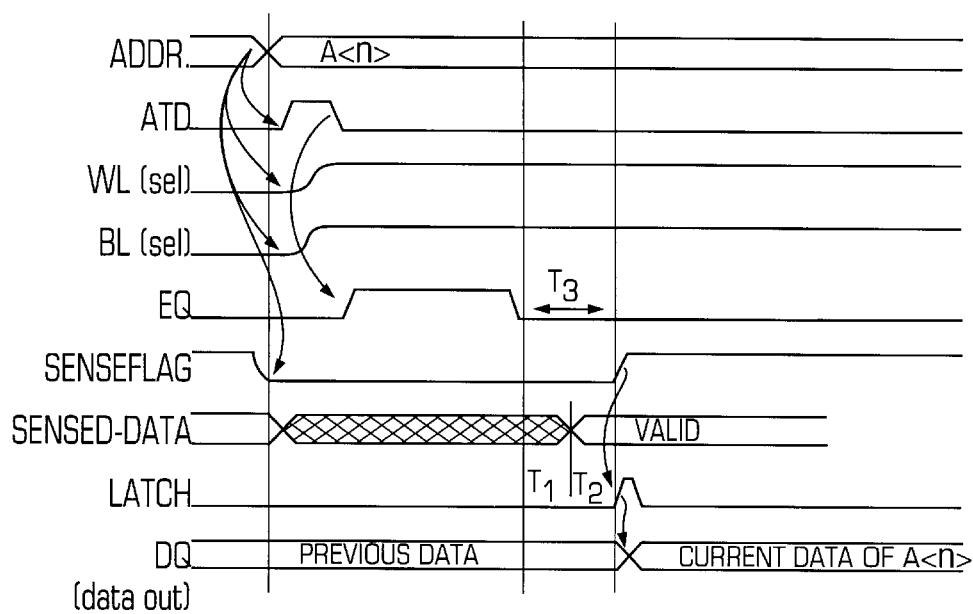
FIG. 4 is a timing diagram showing the operation of the improvement shown in FIG. 3.

Referring to FIG. 4, there is shown a timing diagram for the operation of the sensing circuit 100. In the portion shown as T1, this denotes the time period in which the sense ref signal 102 is compared to the sense signal 104 by the comparator 28. During this time, however, while it is being compared, the output of the comparator 28, Sout, is not latched into the latch 130 until the latch control signal 122 is generated as shown in the line denoted as "LATCH." The LATCH signal shown in FIG. 4 is generated at the end of the timing period T3, which is during the time period in which sense ref signal 102 is compared to the margin 0 ref signal 108 and the margin 1 ref signal 106. When the sense ref signal 102 is between the margin 0 ref signal 104 and the margin 1 ref signal 106, the latch control signal 122 is then generated which latches the Sout signal into the latch 130. At that point, the data is valid.

Figure 5:
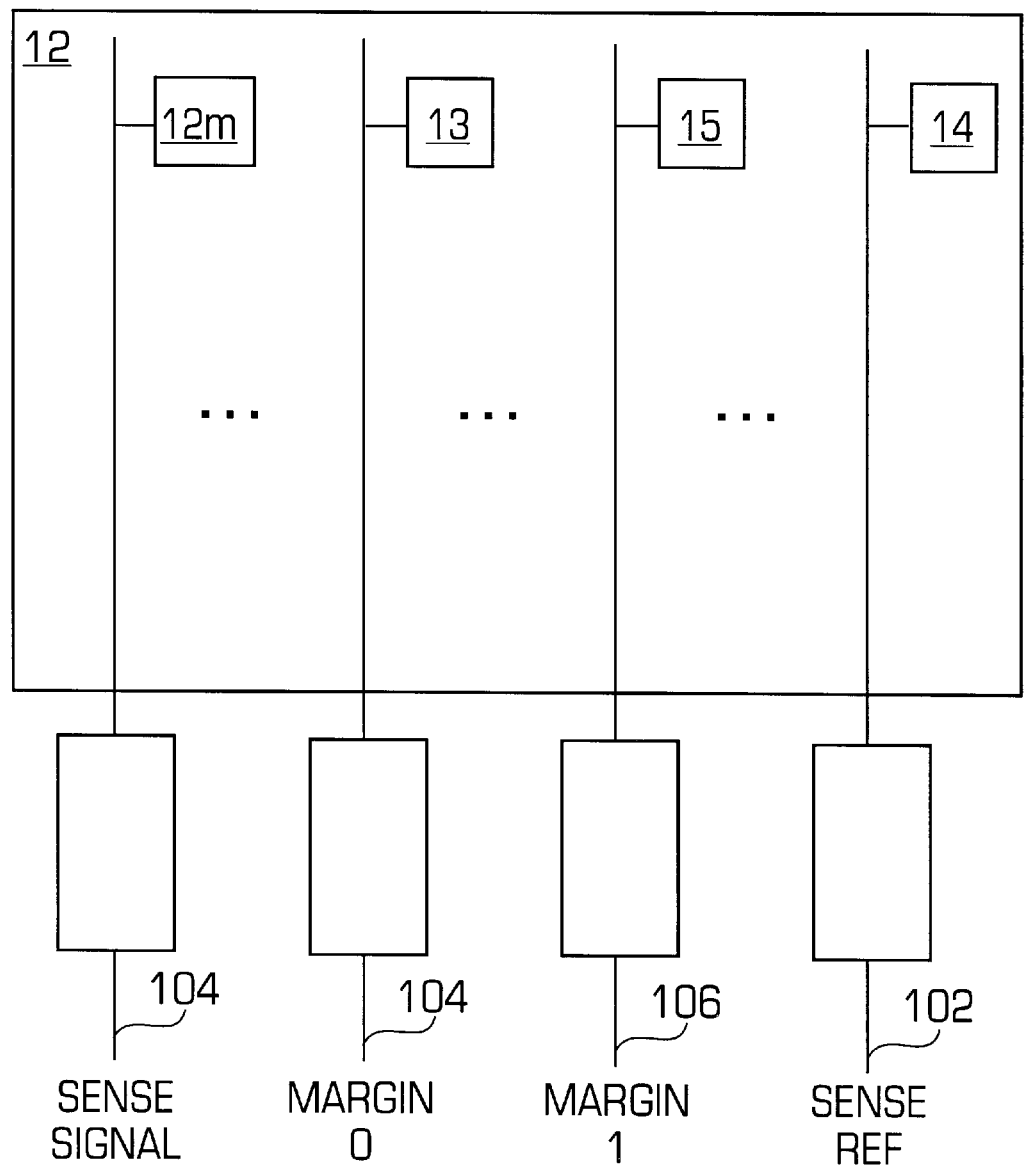
FIG. 5 is a block level diagram showing the mechanism to generate the margin reference signals used in the present invention.

In the preferred embodiment, the margin 0 ref signal 108 and the margin 1 ref signal 106 are margin signals generated on the memory cell array 12, using the same cell process technology that made the memory cell 12m, and the associated amplifiers and detecting circuitry, and the dummy cell 14, and its associated amplifiers and detecting circuitry. Thus, changes in the process would affect all the circuit elements equally. Referring to FIG. 5 there is shown a block level diagram of a memory array 12 with the sensed memory cell 12m, and its associated bit line, and its associated voltage amplifier 20 and current amplifier 22 that generates the sense signal 104. FIG. 5 also shows the memory array 12 with the dummy cell 14, and its associated bit line, and its associated voltage amplifier 24 and current amplifier 26 that generates the sense ref signal 102. The memory array 12 also comprises a margin 0 dummy cell 13 and its associated bit line, and its associated voltage amplifier 20 and current amplifier 22 that generates the margin 0 ref signal 108. Finally, the memory cell array 12 also comprises a margin 1 dummy cell 15 and its associated bit line, and its associated voltage amplifier 20 and current amplifier 22 that generates the margin 1 ref signal 106.

As can be seen from FIG. 5, the generation of the margin 0 ref signal 108 and the margin 1 ref signal 106 is from the same memory array 12 as the sensed signal 104 and the sense ref signal 102. Thus, any process variation in the manufacturing of the dummy cell 14 and its associated bit line, and its associated voltage amplifier 24 would affect the cells 13 and 15 alike, along with their associated bit lines and amplifiers. Although it is preferred that the margin 0 ref signal 108 and the margin 1 ref signal 106 be generated in the same manner as the sense signal 104 and the sense ref signal 106, i.e. with dummy cell, associated bit line, and associated amplifiers, it should be understood that the invention is not so limited. So long as the margin ref 0 signal 108 and the margin 1 ref signal 106 are generated on the same chip as the memory cell array 12 and is subject to the same process variations, the signals 104 and 106 can be used.

Further, in the preferred embodiment, the cells 13 and 15 are kept in the programmed state with only their associated voltage amplifier 20 and current amplifier 22 being different to generate the different resulting signals margin 0 ref signal 108 and margin 1 ref signal 106. However, it should be apparent to one having ordinary skill in the art that the cells 13 and 15 can also be kept in the erased state and with only their associated voltage amplifier 20 and current amplifier 22 being different to generate the different resulting signals margin 0 ref signal 108 and margin 1 ref signal 106. Finally, of course, the cells 13 and 15 can be kept in a programmed state and erased state, respectively, with no difference in their associated voltage amplifier 20 and current amplifier 22 to generate the different resulting signals margin 0 ref signal 108 and margin 1 ref signal 106.

As can be seen, compared to the prior art where a delay was interjected between the output of the sensing circuit 10 and the output buffer, there has never been any way to insure that the delay corresponds to the signal validly tracking operational or processing conditions on the memory device. In the present invention, the sense data from the comparator 28 is not latched in the output buffer until the sense ref signal 102 is assured to be within the margin of tolerance subject to the same process variations as that which manufactured the selected cell 12m and the associated bit line, and signal processing circuitry.

What is claimed is:

1. A method of sensing a memory signal from a selected memory cell of a memory device comprising the steps of:

comparing a reference signal generated from said memory device to a threshold signal, generated from said memory device, to determine the operational status of said memory device;

comparing the memory signal to said reference signal and generating a sensed signal; and outputting said sensed signal in response to the comparison between said reference signal and said threshold signal.

2. The method of claim 1 wherein said reference signal is compared to a plurality of threshold signals to determine the operational status of said memory device.

3. The method of claim 1 wherein said outputting step further comprises:

storing said sensed signal in a latch in response to the comparison between said reference signal and said threshold signal.

4. The method of claim 3 wherein said reference signal is compared to two threshold signals to determine the operational status of said memory device.

5. The method of claim 4 wherein said sense signal is stored in said latch in response to the reference signal being between said two threshold signals.

6. The method of claim 1, wherein each of said reference signal, threshold signal and memory signal, is generated from a memory cell having an associated bit line and an associated signal processing circuitry.

7. The method of claim 6 wherein said associated bit line and associated signal processing circuitry are substantially identical.

8. A sensing apparatus for a memory device for receiving a reference signal generated on said memory device, and a sensed signal generated from a selected memory cell of the memory device, said apparatus comprising:

a circuit, on said memory device, for generating a margin signal;

a comparator for receiving the reference signal and said margin signal and for generating a latching signal in response thereto;

a sense amplifier for receiving the reference signal and the sensed signal and for generating an output signal; and logic circuit for outputting said output signal in response to said latching signal.

9. The apparatus of claim 8 wherein said logic circuit further comprises:

a control circuit for receiving said latching signal and a control signal and for generating a set signal in response thereto; and a latch for receiving said output signal and said set signal and for storing said output signal in said latch in response to said set signal;

wherein said latch having an output terminal for supplying an output of said sensing apparatus.

10. The apparatus of claim 8 wherein said comparator receives the reference signal and two margin signals.

11. The apparatus of claim 10 wherein said comparator generates said latching signal in the event the reference signal is greater than one margin signal and less than the other margin signal.

12. The apparatus of claim 11, wherein each of said margin signals is generated from a memory cell, with it associated bit line, and associated signal processing circuitry.

* * * * *